United States Patent Office 3,406,065

Patented Oct. 15, 1968

3,406,065

PROCESS FOR THE REVERSAL DEVELOPMENT OF REPRODUCTION COATINGS CONTAINING O-NAPHTHOQUINONE DIAZIDE COMPOUNDS

Fritz Uhlig, Wiesbaden-Biebrich, Germany, assignor, by mesne assignments, to Azoplate Corporation, Murray Hill, N.J., a corporation of New Jersey No Drawing. Filed Aug. 20, 1964, Ser. No. 391,021
Claims priority, application Germany, Aug. 23, 1963, K 50,617
6 Claims. (Cl. 96—33)

ABSTRACT OF THE DISCLOSURE

This invention relates to a process for producing a positive printing plate from a negative original, which comprises exposing to light under the original a light-sensitive layer containing an o-naphthoquinone diazide and carried on a support, developing the exposed material by treatment with an aqueous alkaline developing solution, removing in said development the exposed areas of the layer from the support, thereafter coating the layer-covered surface of the support with a lacquer the non-volatile components of which are soluble in aromatic hydrocarbons, and then removing from the support those areas originating from the layer, which had been covered during the image-wise exposure, by the application of a solvent capable of dissolving them, together with the lacquer on them.

Light-sensitive materials sensitized with o-quinone-diazides having the advantage of a good shelf-like and can be used for producing a positive image which can be used as a printing plate by exposing the material to light under a photographic diapositive, removing the light-decomposition product by treatment with an alkaline solution and inking up the unexposed areas.

Attempts have also been made to produce positive printing plates from materials sensitized with o-naptho-quinonediazides after exposure under a negative original. So far it has been necessary in this case to include in the light-sensitive coating, a relatively large amount of a thermoplastic polymeric substance.

The object of the invention is to enable a positive printing plate to be made from a negative original without the necessity of including such polymeric substances in the light-sensitive layer.

The invention accordingly provides a process of producing a positive printing plate from a negative original, which comprises exposing to light under the original a light-sensitive layer containing an o-naphtoquinone diazide and carried on a support, developing the exposed material by treatment with an aqueous alkaline developing solution removing in the development the exposed areas of the layer from the support. According to the invention, the layer-coated surface of the support is coated thereafter with a lacquer the non-volatile components (or solid content) of which are soluble in aromatic hydrocarbons, and then those areas originating from the light-sensitive layer, which had been covered during the image-wise exposure are removed from the support by the application of a solvent capable of dissolving these parts of the layer, together with the lacquer on them. The lacquers which have to be applied according to the invention contain as the lacquer base material one or more resins, preferably resins which are resistant to aqueous alkaline solutions and adhere firmly to the bared areas of the support. It is, however, not in all events necessary that the resin or resins of the lacquer be resistant to alkaline solutions.

The process of the invention comprises carrying out one of the two following methods, after the aforedescribed alkaline development of the image-wise exposed layer: either exposing the developed light-sensitive layer to light again without an original, coating it with a film-forming lacquer, which is resistant to aqueous alkaline decoating solutions, which adheres firmly to the bared areas of the support and which forms a porous and weakly adherent layer on the light decomposition product and thereafter again treating the lacquered layer with such a developing solution, or coating the developed light-sensitive layer with a film-forming lacquer and subsequently treating it with a solvent capable of dissolving the light-sensitive layer.

The following are examples of film-forming alkali-resistant resins which are suitable as lacquer bases: cyclisation products of natural rubber, resinous chlorinated diphenyls maleinate resins, hardened resins and zinc-lime hardened resins having a melting point above 100° C., copolymers of polyvinylchloride and vinyliso-butyl-ether, phenol resins which are modified with natural rubber, urea-formaldehyde condensation products, melamine resins, modified alkyd resins, epoxy resins, polyacrylic acid methyl ester, polymethacrylic acid methyl ester and mixtures of these resins. Chlorination products of natural and synthetic rubbers are particularly advantageous. In their commercially available form they normally contain 62–66 percent by weight of chlorine. Rubbers containing a lower percentage of chlorine are, however, also suitable, for example rubbers containing 30–62 percent by weight of chlorine. If desired, such chlorinated rubbers may be used in conjunction with one or more of the above resins.

These lacquer bases are used in solution in an organic solvent or a mixture of organic solvents which do not dissolve the light-sensitive coating and its light decomposition product, the solution normally containing 1–15 percent and preferably 5–10 percent by weight of the lacquer base. The following are examples of suitable solvents: aromatic hydrocarbons, such as toluene, xylene and mesitylene: hydrogenated aromatic hydrocarbons, such as cyclohexane, menthane and dipentene: hydrogenated naphthalenes, such as decahydronaphthalene and tetra-hydronaphthalene: glycerol and other polyglycols, such as lower polymethylene glycols, as ethylene glycol or trimethylene glycol.

The lacquer may also contain one or more plasticizers such for example as: phthalic acid esters, paraffin oil, chloroparaffins, chlorodiphenyl resins, sulphur-containing hydrocarbons, polyvinylmethylethers and aldehyde, ketone and/or coumarone resins. The lacquer also normally includes a dye which is soluble in organic solvents, in an amount of 0.1 to 5 percent by weight, in order to obtain a clearly colored image on the printing plate. The following substances may for example be used: Rhodamine B (864), Litholrubin (194), Fettscharlach G (153), Fettrot HRR, Sudanblau (816), Sudanrot (976), Fettrot A (864) and Rheinblau (816). The figures in brackets are taken from Schultz, "Farbstofftabellen," 7th edition, volume 1. Fettrot HRR is an azo dye of the formula $C_{22}H_{16}N_4O$, and is prepared by coupling 1 mole of p-aminoazobenzene with 1 mole of $\beta$-naphthol.

The lacquers used in accordance with the present invention are film-forming and adhere extremely firmly to the bared image areas of the support of the light-sensitive material; but they form only a porous layer, which is not firmly adherent, on the light decomposition product in the non-image areas.

The light-sensitive layer consists mainly of one or more o-naphthoquinonediazides, but may also contain dyestuffs and resins, for example alkali-soluble phenol resins of the Novolak type. The addition of a dye makes the layer clearly visible which is desirable in some cases. Normally, however, such additions are not required.

When preparing the light-sensitive material the o-naphthoquinonediazide, which is practically insoluble in water, is dissolved in an organic solvent, for example a glycol ether, to which the resin and/or dyestuff is added if desired. Generally the coating solution contains 0.1 to 10 percent, preferably 0.5 to 2 percent by weight of the diazide.

The support may be of any of the metals which are commonly used for litho printing, for example aluminum or zinc. Non-metal supports, e.g. of suitable paper or plastic foil can also be used.

In use, the light-sensitive layer is exposed to a strong light source through a negative original, and is then developed by treatment with a dilute aqueous alkaline developing solution, which removes the exposed areas of the layer. The alkaline solution may be applied by wiping, by dipping the exposed material into a developing bath, or by mechanical devices, such as rollers. The alkaline substances used may be inorganic or organic. The following are examples of suitable inorganic alkaline substances: alkali metal phosphates, in particular sodium phosphates, alkali metal polyphosphates, such as sodium polyphosphates, alkali metal silicates, such as sodium and potassium silicates, mixed silicates, such as sodium-potassium silicates; ammonia, alkali metal hydroxides and alkaline-earth metal hydroxides, preferably ammonium, sodium, potassium and calcium hydroxide. Examples of suitable organic alkaline substances are: primary, secondary and tertiary saturated amines; such as ethylamine, trimethylamine, diethylamine, triethylamine, propylamine, butylamine, isobutylamine, dibutylamine and octylamine; piperidine, N-methylpiperidine, morpholine; aminoalcohols, such as mono-, di- or triethanolamine and substituted carboxylic acid amides of sufficiently high basicity, for example dimethylformamide. It is particularly advantageous to use inorganic alkaline substances in purely aqueous solution. Preferably the aqueous solution is used at room temperature and contains 0.1 to 15 percent, e.g. 2 to 5 percent by weight of the alkaline substance. The solution may also contain an organic solvent which is miscible with water, for example an alcohol or ketone, but this is generally unnecessary. After the alkaline treatment, excess developing solution is rinsed off thoroughly with water and the printing plate is dried, preferably with hot air or in a drying oven.

Further treatment of the printing plate may be effected in two different ways.

According to the first method, the entire image area of the printing plate is exposed a second time to light, but without an original, so that the light-sensitive material is also decomposed in the non-image areas. The entire image area is coated with a film-forming lacquer as described above, preferably by wiping over the plate with a pad or by spraying. The plate is then dried, for example for 15 minutes at 30 to 50° C. The second exposure without the original may also be carried out after the lacquering operation. In this case, however, a longer exposure is required, because the light has to penetrate the coating of lacquer. Finally, the entire printing plate is treated, by wiping or dipping, with an aqueous alkaline developer. Preferably the alkaline solution used is that which was used after the first exposure, or is a solution which is slightly more alkaline than the first solution. The developer penetrates through the porous coating of lacquer to the light-decomposition product and removes it together with the lacquer deposited on it. The lacquer which adheres directly to the support in the image areas is not affected. After rinsing off the excess developer the plate is wiped over—if desired after brief treatment with 2 percent phosphoric acid to increase the oleophilic properties of the support—with greasy, preferably black ink, whereupon the lacquered image areas become deeply colored, whereas the ink is repelled in the non-image areas. It is also possible to ink up the plate immediately after lacquering, thus giving the lacquered areas additional resistance to the ensuing decoating treatment with the alkaline solution.

According to the second method, one of the above film-forming lacquers is applied to the printing plate, after it has been exposed through a negative master and subjected to the preliminary treatment with an alkaline developer and then rinsed and dried, without subjecting the plate to a second exposure, thus lacquering the bared areas of the support. The lacquered printing plate is then treated with a solvent or a mixture of solvents which removes the light-sensitive material from the unexposed areas of the printing plate. This second method is often preferred to the first method because it saves time, because the light source does not have to be used a second time and because the often somewhat aggressive treatment of the diazo coating decomposed under the influence of light is avoided.

The following substances are suitable as organic solvents: alcohols, such as methanol, ethanol, propanol, isopropanol and butanol; glycols, for example ethyleneglycol, glycol ethers, such as glycolmethylether and glycolethylether; polyglycols, such as diethylene glycol, triethyleneglycol and higher polyethylene glycols; ketones, for example cyclohexanone; and esters, for example butylacetate and amylacetate. Mixtures of these solvents are also suitable. Substances which increase the hydrophilic properties of the bared areas of the support during the decoating process, such as phosphoric acid or sodium metasilicate in the case of aluminum, may be added to the said solvents.

It is possible and often preferable in both methods to carry out an after-treatment with a deep etching agent immediately before lacquering when the support is of metal. 30 to 60 percent aqueous solutions of $CaCl_2$, $ZnCl_2$, $MgCl_2$, $CuCl_2$ and $Fe_2Cl_3$ are suitable deep etching agents. The etching agent may be applied to the plate by wiping. Obviously, the plate does not have to be dried before treatment with an aqueous deep etching agent. If desired, the plate may be wiped over with an aqueous solution of copper salt after the deep etching operation when aluminum is used as the support. The copper is deposited on the aluminum and is lacquered as described above. Particularly long runs are obtained with printing plates which have been so treated with copper.

Positive litho printing plates which can be used in printing machines are thus obtained from negative originals.

When the support is of metal—preferably magnesium or zinc—an etching treatment may be performed before inking up. Blocks for relief printing can be produced in this way.

In the following examples parts are parts by weight.

Example 1

1.5 parts of the reaction product of 1 mole of purpurogallin and 1, 2 or 3 moles of naphthoquinone-(1,2)-diazide-(2)-sulphonic-acid-chloride-(5) (compare British Patent 937,121 or U.S. Patent 3,061,430) are dissolved in 98.5 parts of glycolmonomethylether. The resulting solution is filtered and whirl-coated onto an electrolytically pretreated aluminum plate, which is then dried in hot air. To produce a printing plate, the coated side of the plate is exposed for 2 minutes through a photographic negative to a 40 ampere arc lamp at a distance of 70.0 cm., and the exposed coating is then developed by wiping it over with a 1 percent solution of trisodium phosphate. This leaves the unexposed areas covered with unchanged diazo compound. After rinsing off excess developer with water, the plate is dried and exposed again to light without the original. The entire surface of the plate is then wiped over with a pad of cellulose soaked in a lacquer of the following composition:

| | Percent |
|---|---|
| Chlorinated rubber containing 62–66% chlorine | 7 |
| Highly chlorinated paraffin | 0.5 |
| Xylene | 62 |
| Mesitylene | 20 |
| Paraffin oil | 5 |
| Phthalic acid dimethyl ester | 5 |
| Fettrot HRR | 0.5 |

The lacquered plate is dried for 10 minutes at 40° C., whereupon the coating of lacquer adheres extremely firmly to the bared metal areas of the plate whereas it adheres only loosely and as a porous layer to the light-decomposition product in the non-image areas. The plate is wiped over with a 5 percent solution of trisodium phosphate as described above. This developing solution penetrates through the porous coating of lacquer in the non-image areas and removes the light-decomposition product together with the lacquer deposited on it. A positive lacquer image of the negative original is accordingly obtained on the metal support. After rinsing with water, and wiping over with 1 percent phosphoric acid to increase the hydrophilic properties of the aluminum, the lacquer image is inked up with greasy ink. The printing plate so obtained may be used in an offset printing machine. The shelf-life of this presensitized plate is excellent, and a long run of prints can be made from the finished printing plate.

The reaction product of 1 mole of purpurogallin and 1 or 2 moles of naphthoquinone-(1,2)-diazide-(2)-sulphonic-acid-chloride-(4) can be used with equally good results in place of the reaction product mentioned above.

Example 2

2 parts of 4[naphthoquinone - (1,2) - diazide - (2)-sulphonyloxy - (5)] - 2,3 - dihydroxy-benzophenone and 1 part of 2,2′ - bis-[naphthoquinone - (1,2) - diazide-(2)-sulphonyloxy-(5)]-dinaphthyl - (1,1′) - methane are dissolved in a mixture of 77 parts of glycol monomethylether and 20 parts of butylacetate and the resulting solution is filtered. It is then applied by rollers to a strip of mechanically roughened aluminum which is 0.25 mm. thick. The strip is dried at 85° C. in a drying channel and is then cut into plates. To obtain a printing plate, the coated side of a pre-sensitized plate so produced is exposed under a screened photographic negative and developed by wiping over with an aqueous solution containing 2.5 percent sodium metasilicate and 1.8 percent trisodium phosphate. The plate is rinsed with water, dried and exposed to light a second time without an original. The entire image area is then wiped over for one minute with an aluminum etching agent of the following composition:

| | Percent |
|---|---|
| $CaCl_2$ | 50 |
| $FeCl_3$ | 12 |
| Hydrochloric acid | 2.4 |
| Nitric acid | 1.6 |
| Water | 34 |

This treatment etches the bared aluminum in the image areas and renders it particularly receptive to the subsequent lacquering treatment. The exposed coating in the non-image areas is not attacked. The image area is then wiped over with a lacquer of the following composition:

| | Percent |
|---|---|
| Copolymer of polyvinylchloride with vinylisobutylether | 9 |
| Phenol resin modified with natural resin acids | 1.5 |
| Toluene | 57 |
| Cyclohexane | 20 |
| Paraffin oil | 6 |
| Phthalic acid diethyl ester | 6 |
| Fettrot HRR | 0.5 |

The lacquered plate is dried for 15 minutes at 30° C. and is then brushed over for 1 to 15 minutes with the aqueous alkaline solution mentioned above, using a soft brush, until the light-decomposition product has been removed from the non-image areas. The positive lacquer image of the negative original is inked up with greasy ink. If printing is to be deferred, the entire image surface is preserved by application of a 10 percent aqueous solution of gum arabic.

The naphthoquinone diazide suphonic acid ester of 2,2′,4,4′-tetrahydroxydiphenyl, 2,7-dihydroxynaphthalene or of 2,2′,4,4′-tetrahydroxydiphenylsulphide may be used with equally good results in place of the above mentioned naphthoquinonediazide sulphonic acid ester.

Example 3

2 parts of 1-[naphthoquinone-(1,2)-diazide-(2)-sulphonlyloxy-(5)]-dihydroxy-(3,5)-benzene, 10 parts of a m-cresol-formaldehyde-Novolak and 1 part of polyvinylacetate are dissolved in 90 parts of glycolmonomethylether and filtered. A zinc plate is whirl-coated with this solution and dried with warm air.

To convert this plate into a printing plate, it is exposed as described in Example 1 under a negative and wiped over with a pad soaked in a 1.5 percent solution of sodium hydroxide. After rinsing with water and drying, the plate is exposed a second time without the original. It is wiped over with a lacquer of the following composition:

| | Percent |
|---|---|
| Polymethacrylic acid methyl ester | 8 |
| Toluene | 45 |
| Xylene | 26.5 |
| Mesitylene | 20 |
| Fettrot A | 0.5 |

The lacquered plate is dried for 10 minutes at 40° C. and inked up with greasy ink. It is then wiped over with the alkaline solution described above, until the coating has been removed from the non-image areas. A zinc printing plate for offset printing is obtained.

If an appropriately thick zinc plate is used, a zinc block for relief printing may be obtained by etching plate in with dilute nitric acid.

The reaction product of 1 mole of phloroglucinol and 2 moles of naphthoquinone-(1,2)-diazide-(2)-sulphonic-acid-chloride-(5) may also be used with good results instead of the reaction product mentioned above.

Example 4

3 parts of 3-[naphthoquinone-(1,2)-diazide-(1)-sulphonyloxy-(6)]-dihydroxy-(1,2)-anthraquinone are dissolved in 97 parts of glycolmonomethylether. The solution is filtered and applied to an aluminum plate which has been roughened by sandblasting and the plate is then dried. The plate is exposed as in Example 1 and wiped over with a 2 percent aqueous solution of trisodium phosphate, rinsed, dried and exposed again without an original. The plate is then wiped over for 30 seconds with an etching agent of the following composition:

| | Percent |
|---|---|
| Water | 50 |
| Calcium chloride | 46 |
| Iron chloride | 2.5 |
| Hydrochloric acid | 1 |
| Nitric acid | 0.5 |

The plate is then wiped over with a lacquer of the following composition:

| | Percent |
|---|---|
| Epoxy resin having a melting point between 64 and 76° C. | 7 |
| Mesitylene | 50 |
| Xylene | 40 |
| Tetrahydronaphthalene | 2.5 |
| Reinblau | 0.5 |

The plate is then dried for 10 minutes at 50° C., inked up with greasy ink and decoated with an aqueous solution containing 5 percent of monoethanolamine and 2 percent of sodium metasilicate. An offset printing plate is obtained.

Example 5

3 parts of 4 - [naphthoquinone - (1,2) - diazide - (2)-sulphonyloxy-(5)]-2,3-dihydroxy-benzophenone and 5 parts of an m-cresolformaldehyde-Novolak are dissolved in 92 parts of gycolmonoethylether and the solution is coated onto an aluminum plate which has been roughened by sandblasting. After brief drying in hot air at 100° C. the material can be stored for many months in the dark.

To convert the plate into a printing plate it is exposed under a negative original, developed by treatment with an aqueous solution of 10 percent di- and 1 percent tri-sodium phosphate, rinsed with water and exposed again without the original. The plate is then wiped over for two minutes with an etching solution of the following composition:

| | Percent |
|---|---|
| Water | 65 |
| Calcium chloride | 17 |
| Zinc chloride | 16 |
| Copper chloride | 1.1 |
| Hydrochloric acid | 0.9 |

After rinsing with water and drying, the plate is wiped over for 4 minutes with a solution containing copper of the following composition:

| | Percent |
|---|---|
| Water | 90 |
| Glycerin | 5 |
| Copper chloride | 2.5 |
| Citric acid | 2.5 |

to which ammonia water is added dropwise until a pH value of 8 has been reached.

A thick deposit of copper is formed in the etched aluminum areas. The plate is then lacquered and dried, as described in Example 1, inked up with greasy ink and decoated with a 10 percent aqueous solution of trisodium phosphate.

An offset printing plate yielding long runs is obtained.

Example 6

4 parts of 4,4′-bis-[naphthoquinone-(1,2)-diazide-(2)-sulphonamido-(5)]-dihydroxy-(2,2′)-diphenyl are dissolved in 76 parts of glycolmonomethylether and 20 parts of butylacetate and subsequently filtered. A mechanically roughened and subsequently eloxated aluminum plate is whirl-coated with the solution thus obtained and then dried for 2 minutes at 80° C. To convert this plate into a printing plate it is exposed under a negative as in Example 1 and wiped over with a 5 percent aqueous solution of disodium phosphate. After rinsing with water, the plate is exposed a second time without the film and subsequently lacquered with a lacquer of the following composition:

| | Percent |
|---|---|
| Chlorinated diphenyl resin | 5 |
| Xylene | 60 |
| Mesitylene | 30 |
| Paraffin oil | 4 |
| Litholrubin | 1 |

The lacquered plate is dried for 5 minutes at 60 to 80° C., inked up with greasy ink and decoated with a 10 percent aqueous solution of trisodium phosphate. An offset printing plate is obtained.

Instead of 4 parts of the above mentioned naphthoquinone-diazide compound the same amount of 1-[napthoquinone - (1,2) - diazide - (2) - sulphonamido - (5)]-3-hydroxybenzene or of 2-[naphthoquinone-(1,2)-diazide-(2)-sulphonamido-(4)]-7-hydroxynaphthalene can also be used with equally good results.

Example 7

3 parts of 1 - [naphthoquinone - (1,2) - diazide - (2)-sulphonyloxy-(5)-dihydroxy-(3,5)-benzene] prepared as disclosed in British Patent 937,123 or U.S. Patent 3,130,-047, are dissolved in 97 parts of glycolmonomethylether and filtered. A strip of electrolytically pre-treated aluminum strip is coated with this solution by roller application and is subsequently dried for 2 minutes and cut into plates. The presensitized plates so obtained can be stored for several months in the dark.

To convert such a presensitized print into a printing plate, it is exposed under a negative as in Example 1 and wiped over with a 3 percent aqueous solution of sodium metasilicate. After rinsing with water and drying, the plate is coated with the lacquer described in Example 1.

The lacquered plate is thoroughly dried in hot air. The diazo coating is then removed from the non-image areas by treatment with a solution of the following composition:

| | Parts by weight |
|---|---|
| Triethyleneglycol | 45 |
| Glycolmonoethylether | 45 |
| 10 percent solution of orthophosphoric acid | 10 |

The plate is then inked up with greasy ink and wiped over with a 1 percent aqueous solution of orthophosphoric acid if it is desired to increase the hydrophilic properties of the aluminum. An offset printing plate is obtained.

It will be obvious to those skilled in the art that many modifications may be made within the scope of the present invention without depatring from the spirit thereof, and the invention includes all such modifications.

What is claimed is:

1. A process of producing a positive printing plate from a negative original, which comprises exposing to light under the original a light-sensitive layer containing an o-naphthoquinone diazide and carried on a support, developing the exposed material by treatment with an aqueous alkaline developing solution, removing in said development the exposed areas of the layer from the support, thereafter coating the layer-covered surface of the support with a lacquer the non-volatile components of which are soluble in aromatic hydrocarbons, and then removing from the support those areas originating from the layer, which had been covered during the image-wise exposure, by the application of a solvent which penetrates the lacquer to dissolve the unexposed areas of light sensitive material underneath and causes the lacquer covering these areas to be removed with the dissolved unexposed areas.

2. The process of claim 1, wherein the lacquer contains non-volatile components which are resistant to alkaline solutions.

3. The process of claim 2, wherein the lacquer contains a chlorinated rubber.

4. The process of claim 3, wherein the chlorinated rubber contains 30 to 60 percent by weight of chlorine.

5. The process of claim 3, wherein the chlorinated rubber contains 62 to 66 percent by weight of chlorine.

6. The process of claim 1, wherein the support is metal and the layer-covered surface of the support is etched after the removal of the areas of the layer which had been exposed during the image-wise exposure, and before the application of the lacquer.

References Cited

UNITED STATES PATENTS

| | | | |
|---|---|---|---|
| 2,875,046 | 2/1959 | Marron et al. | 96—33 |
| 3,201,239 | 8/1965 | Neugebauer et al. | 96—33 X |
| 3,287,128 | 11/1966 | Lugasch | 96—33 |

OTHER REFERENCES

Handbook of Plastics, Simonds & Ellis, 1943, pp. 450–455 and 463.

NORMAN G. TORCHIN, *Primary Examiner.*

R. E. MARTIN, *Assistant Examiner.*